(12) United States Patent
Maindron et al.

(10) Patent No.: US 10,804,326 B2
(45) Date of Patent: Oct. 13, 2020

(54) MONOLITHIC DISPLAY DEVICE INCLUDING INTEGRATED CONTROL CIRCUIT AND METHOD FOR PRODUCING THE SAME

(71) Applicant: Commissariat à l'Énergie Atomique et aux Énergies Alternatives, Paris (FR)

(72) Inventors: Tony Maindron, Grenoble (FR); Benoit Racine, Bevenais (FR); François Templier, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 16/335,149

(22) PCT Filed: Oct. 13, 2017

(86) PCT No.: PCT/FR2017/052824
§ 371 (c)(1),
(2) Date: Mar. 20, 2019

(87) PCT Pub. No.: WO2018/073515
PCT Pub. Date: Apr. 26, 2018

(65) Prior Publication Data
US 2019/0280048 A1    Sep. 12, 2019

(30) Foreign Application Priority Data

Oct. 21, 2016  (FR) .................................... 16 60225

(51) Int. Cl.
*H01L 27/32* (2006.01)
*H01L 33/00* (2010.01)
(Continued)

(52) U.S. Cl.
CPC .......... *H01L 27/286* (2013.01); *H01L 27/322* (2013.01); *H01L 27/3211* (2013.01);
(Continued)

(58) Field of Classification Search
CPC . H01L 27/286; H01L 27/3211; H01L 27/322; H01L 27/3225; H01L 27/3244;
(Continued)

(56) References Cited

U.S. PATENT DOCUMENTS

| 5,583,350 A | 12/1996 | Norman et al. |
| 7,994,524 B1 * | 8/2011 | Chung ................. H01L 27/156 257/100 |

(Continued)

FOREIGN PATENT DOCUMENTS

WO    WO 2015/081289 A1    6/2015

OTHER PUBLICATIONS

International Search Report and Written Opinion for International Application No. PCT/FR2017/052824, dated Jan. 19, 2018.
(Continued)

*Primary Examiner* — Didarul A Mazumder
(74) *Attorney, Agent, or Firm* — Wolf, Greenfield & Sacks, P.C.

(57) ABSTRACT

A monolithic display device including a plurality of first pixels capable of emitting light in a first wavelength range, and a plurality of second pixels capable of emitting light in a second wavelength range, the first pixels each including a gallium nitride light-emitting diode, and the second pixels each including an organic light-emitting diode.

12 Claims, 2 Drawing Sheets

(51) Int. Cl.
  *H01L 27/28*    (2006.01)
  *H01L 33/32*    (2010.01)
  *H01L 51/56*    (2006.01)
  *H01L 25/075*   (2006.01)

(52) U.S. Cl.
  CPC ...... *H01L 27/3225* (2013.01); *H01L 27/3244* (2013.01); *H01L 33/007* (2013.01); *H01L 33/32* (2013.01); *H01L 51/56* (2013.01); *H01L 25/0753* (2013.01); *H01L 2227/323* (2013.01)

(58) Field of Classification Search
  CPC ....... H01L 33/007; H01L 33/32; H01L 51/56; H01L 25/0753; H01L 2227/323; H01L 25/075; H01L 27/32
  USPC ....................................... 257/40; 438/82, 99
  See application file for complete search history.

(56) References Cited

U.S. PATENT DOCUMENTS

| 2010/0156280 | A1* | 6/2010  | Song ............... H01L 51/5265 313/504 |
| 2012/0286305 | A1* | 11/2012 | Sasaki ............. H01L 51/5218 257/89 |
| 2014/0159007 | A1* | 6/2014  | Song ................ H01L 27/322 257/40 |
| 2015/0060807 | A1* | 3/2015  | Koshihara ......... H01L 27/3248 257/40 |
| 2015/0102291 | A1* | 4/2015  | Park .................. H01L 27/3276 257/40 |
| 2015/0255505 | A1* | 9/2015  | Jeoung ............... H05K 1/189 257/89 |

OTHER PUBLICATIONS

PCT/FR2017/052824, Jan. 19, 2018, International Search Report and Written Opinion .

\* cited by examiner

MONOLITHIC DISPLAY DEVICE INCLUDING INTEGRATED CONTROL CIRCUIT AND METHOD FOR PRODUCING THE SAME

This application is a national stage filing under 35 U.S.C. § 371 of International Patent Application Serial No. PCT/FR2017/052824, filed Oct. 13, 2017, which claims priority to French patent application FR16/60225, filed Oct. 21, 2016. The entire contents of these applications are incorporated herein by reference in their entirety.

BACKGROUND

The present disclosure concerns the field of emissive display devices. It more particularly aims at a monolithic emissive display device comprising a plurality of light-emitting diodes and an electronic circuit capable of individually controlling the diode to display images. It also aims at a method of manufacturing such a device. The present application more particularly relates to the field of color image display devices.

DISCUSSION OF THE RELATED ART

Display devices comprising a plurality of organic light-emitting diodes and one control circuit enabling to individually control the diodes to display images have already been provided. To display color images, such devices may comprise organic light-emitting diodes capable of emitting light of different wavelength ranges.

A disadvantage of such devices is the relatively short lifetime of organic light-emitting diodes, particularly when the latter are provided to operate at high luminance levels, for example, above 10,000 cd/m². In particular, if it is known to form organic light-emitting diodes capable of emitting green light or red light at high luminance levels while having long lifetimes, it is to date difficult to obtain light-emitting diodes capable of emitting blue light at high luminance levels and having long lifetimes.

Display devices comprising a plurality of inorganic gallium nitride light-emitting diodes and one control circuit enabling to individually control the diodes to display images have further been provided. Gallium nitride light-emitting diodes are indeed capable of emitting at high luminance levels and have long lifetimes. In such a device, the light-emitting diodes generally all emit in a same wavelength range, typically blue light. To be able to display color images, the red and green pixel diodes are then coated with color conversion elements, for example, made up of phosphorus, capable of converting into red light or into green light the blue light emitted by the diodes.

A disadvantage of such devices lies in the constraints associated with the forming of color conversion elements, particularly in terms of bulk and/or of manufacturing cost.

It would be desirable to have a color image display device which overcomes all or part of the disadvantages of known devices.

SUMMARY

Thus, an embodiment provides a monolithic display device comprising a plurality of first pixels capable of emitting light in a first wavelength range, and a plurality of second pixels capable of emitting light in a second wavelength range, the first pixels each comprising a gallium nitride light-emitting diode, and the second pixels each comprising an organic light-emitting diode.

According to an embodiment, the device comprises an integrated control circuit comprising, on the side of a first surface, for each pixel, a metal connection pad, the light-emitting diodes of the first and second pixels being arranged on the side of the first surface of the control circuit, and the light-emitting diode of each pixel comprising a first electrode connected to the metal connection pad of the pixel.

According to an embodiment, in each pixel, the light-emitting diode of the pixel comprises at least one semiconductor layer coating the surface of the first electrode opposite to the control circuit, and a second electrode coating the surface of said at least one semiconductor layer opposite to the first electrode.

According to an embodiment, the second electrodes of the light-emitting diodes of the first and second pixels are interconnected.

According to an embodiment, the second electrodes of the first pixels and the first electrodes of the second pixels are arranged in a same conductor level of the device.

According to an embodiment, the semiconductor layer of the second pixels is a continuous layer common to all the second pixels of the device and extending over substantially the entire surface of the device.

According to an embodiment, in each first pixel, the second electrode of the pixel is insulated from said at least one semiconductor layer of the second pixels by a local insulation layer.

According to an embodiment, the semiconductor layer of the second pixels is a discontinuous layer located at the level of the light-emitting diodes of the second pixels only.

Another embodiment provides a method of manufacturing a monolithic display device comprising a plurality of first pixels capable of emitting light in a first wavelength rage and a plurality of second pixels capable of emitting light in a second wavelength range, the method comprising the successive steps of:

a) forming an integrated control circuit comprising, on a first surface, for each pixel of the device, a metal connection pad;

b) for each first pixel, placing on the first surface of the control circuit an active gallium nitride light-emitting diode stack comprising a first electrode in contact with the metal connection pad of the pixel, and at least one semiconductor layer coating the surface of the first electrode opposite to the control circuit;

c) filling a volume laterally separating the active stacks of the gallium nitride light-emitting diodes with an insulating filling material;

d) forming, in a same conductive level, for each first pixel, a second electrode coating the surface of the semiconductor layer opposite to the first electrode and, for each second pixel, a first electrode coating the filling material and connected to the metal connection pad of the pixel.

According to an embodiment, the method further comprises, after step d), a step e) of deposition, for each second pixel, of at least one organic semiconductor layer coating the surface of the first electrode of the pixel opposite to the control circuit.

According to an embodiment, the organic semiconductor layer is a continuous layer common to all the second pixels of the device and extending over substantially the entire surface of the device.

According to an embodiment, the method further comprises, between step d) and step e), a step of forming a local insulating layer insulating the second electrodes of the first pixels from the organic semiconductor layer.

According to an embodiment, the organic semiconductor layer is a discontinuous layer located at the level of the light-emitting diodes of the second pixels only.

According to an embodiment, the method further comprises, after step e), a step of depositing, for each second pixel, a second electrode coating the surface of the organic semiconductor layer opposite to the first electrode of the pixel.

According to an embodiment, the second electrodes of the second pixels form a continuous layer extending over substantially the entire surface of the device.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1A:
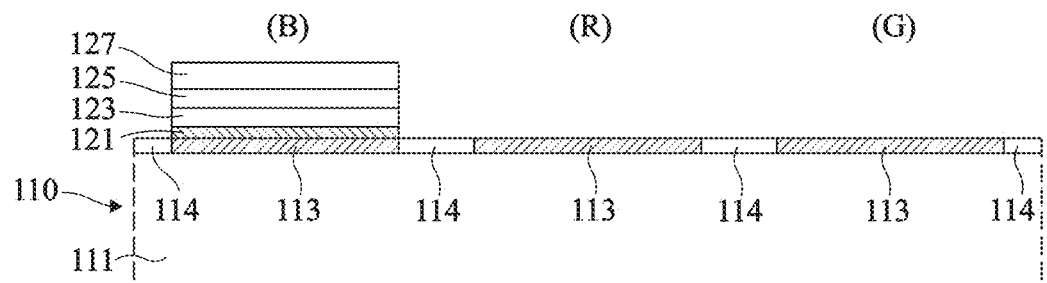
FIGS. 1A, 1B, 1C, and 1D are cross-section views schematically illustrating an embodiment of a method of manufacturing a color image display device.

The same elements have been designated with the same reference numerals in the various drawings and, further, the various drawings are not to scale. For clarity, only those steps and elements which are useful to the understanding of the described embodiments have been shown and are detailed. In particular, the composition and the arrangement of the different layers of an active organic light-emitting diode stack, and the composition and the arrangement of the different layers of an active gallium nitride light-emitting diode stack have not been detailed, the described embodiments being compatible with usual active stacks of organic light-emitting diodes and of gallium nitride light-emitting diodes. Further, the forming of an integrated circuit for controlling the light-emitting diodes has not been detailed, the described embodiments being compatible with usual structures and methods of manufacturing of such control circuits.

In the following description, when reference is made to terms qualifying absolute positions, such as terms "front", "back", etc., or relative positions, such as terms "above", "under", "upper", "lower", etc., or to terms qualifying directions, such as terms "horizontal", "vertical", etc., it is referred to the orientation of the cross-section views of FIG. 1A, 1B, 1C, 1D, or 3, it being understood that, in practice, the described devices may be oriented differently. The terms "approximately", "substantially", and "in the order of" are used herein to designate a tolerance of plus or minus 10%, preferably of plus or minus 5%, of the value in question.

According to an aspect of an embodiment, it is provided, in a monolithic color image display device, to co-integrate inorganic gallium nitride light-emitting diodes capable of emitting light in a first wavelength range, for example, blue light (that is, having a wavelength in the range from 450 to 490 nm), and organic light-emitting diodes capable of emitting light in one or a plurality of other wavelength ranges, for example, green light (that is, having a wavelength in the range from 490 to 570 nm) and red light (that is, having wavelength in the range from 600 to 700 nm).

FIGS. 1A, 1B, 1C, and 1D are cross-section views schematically illustrating successive steps of an embodiment of a method of manufacturing such a device. FIGS. 1A, 1B, 1C, and 1D more particularly show the forming of three pixels B, R, and G of the device, each comprising a light-emitting diode, and being capable of emitting light respectively in three different wavelength bands. As an example, the B, R, and G pixels are capable of respectively emitting blue light, red light, and green light. In practice, the display device may comprise a plurality of identical or similar B pixels, a plurality of identical or similar R pixels, and a plurality of identical or similar G pixels, and the pixels of each type B, R, and G may be regularly distributed over substantially the entire surface of the device, for example, in an array layout.

FIG. 1A schematically shows an integrated control circuit 110, previously formed inside and on top of a semiconductor substrate 111, for example, a silicon substrate. In this example, control circuit 110 comprises, on its upper surface side, for each B, R, and G pixel of the device, a metal connection pad 113 intended to be connected to one of the electrodes (anode or cathode) of the light-emitting diode of the pixel, to be able to control a current flowing through the diode and/or a voltage applied to the diode. The control circuit for example comprises, for each pixel, connected to metal pad 113 of the pixel, an elementary control cell comprising one or a plurality of transistors, enabling to control the current and/or the voltage applied to the pixel diode. Control circuit 110 is for example made in CMOS technology. Metal pads 113 may be laterally surrounded with an insulating material 114, for example, silicon oxide, so that control circuit 110 has a substantially planar upper surface comprising an alternation of metal pads 113 and of insulating regions 114. As will be explained in further detail hereafter, the contact on the other electrodes (not connected to pads 113) of the light-emitting diodes may be taken collectively, for example, in a peripheral region of control circuit 110, via one or a plurality of connection pads (not shown in the drawings) of control circuit 110.

FIG. 1A more particularly illustrates a step of placing, on each connection pad 113 of a pixel B of the device, an active gallium nitride light-emitting diode stack. In this example, the active stack placed on the control circuit is a vertical stack comprising, in the following order from the surface of connection pad 113, a conductive layer 121, for example, made of metal, a P-type doped gallium nitride layer 123, an emissive layer 125, and an N-type doped gallium nitride layer 127. Emissive layer 125 is for example formed by a stack of one or a plurality of emissive layers, each forming a quantum well, for example, made up of GaN, InN, InGaN, AlGaN, AlN, AlInGaN, GaP, AlGaP, AlInGaP, or of a combination of one or a plurality of these materials. As a variation, emissive layer 125 may be an intrinsic, that is, non-intentionally doped, gallium nitride layer, for example having a residual donor concentration in the range from $10^{15}$ to $10^{18}$ atoms/$cm^3$, for example, in the order of $10^{17}$ atoms/$cm^3$. In this example, the upper surface of emissive layer 125 is in contact with the lower surface of layer 127, the lower surface of emissive layer 125 is in contact with the upper surface of layer 123, the lower surface of layer 123 is in contact with the upper surface of layer 121, and the lower surface of layer 121 is in contact with the upper surface of pad 113. Conductive layer 121 forms the anode electrode of the diode of pixel B, layers 123 and 127 respectively forming the semiconductor anode and cathode layers of the diode. As a variation, it is possible for the stack placed on control circuit 110 not to comprise conductive layer 121, in which case the semiconductor layer 123 of the stack directly comes into contact with the metal pad 113 of the control circuit, pad 113 then forming the anode electrode of the diode of pixel B.

In the shown example, the stack placed on control circuit 110 at the step of FIG. 1A does not comprise the upper electrode of the diode of pixel B (its cathode electrode in the present example), that is, the electrode coating the surface of layer 127 opposite to layer 123. This upper electrode will indeed be deposited at a subsequent step, at the same time as the lower electrodes of the light-emitting diodes of the R and G pixels.

The stack of the gallium nitride diode placed on control circuit 110 at the step of FIG. 1A may be previously formed by epitaxy on an adapted support substrate, for example, a sapphire or corundum substrate (not shown). More particularly, layers 127, 125, and 123 may be successively formed by epitaxy from a surface of the support substrate, after which layer 121 may possibly be deposited on the surface of layer 123 opposite to the support substrate. The support substrate may then be removed, after which the diodes may be individualized, for example, by sawing. To cut the diodes into individual chips, an adhesive holding film may previously be arranged on the surface side of the active stack opposite to the support substrate. Once the diodes have been individualized, they can be arranged one by one on control circuit 110, to obtain the structure of FIG. 1A.

As a variation, the active stack may be placed in one piece on the upper surface of control circuit 110, before cutting of the stack into individual diodes, so that the stack substantially covers the entire surface of control circuit 110. The support substrate of the active stack may then be removed, for example, by machining, after which the active stack may then be locally removed by etching opposite the R and G pixels, to only keep portions of the active stack above the B pixels of the sensor, to obtain the structure of FIG. 1A.

At the end of the step of FIG. 1A, the active portions of the light-emitting diodes of pixels B form separate pads or islands arranged on the upper surface of control circuit 110. The pads or islands for example have a thickness in the range from 0.1 to 1 μm, for example, in the order of 0.5 μm.

Figure 1B:
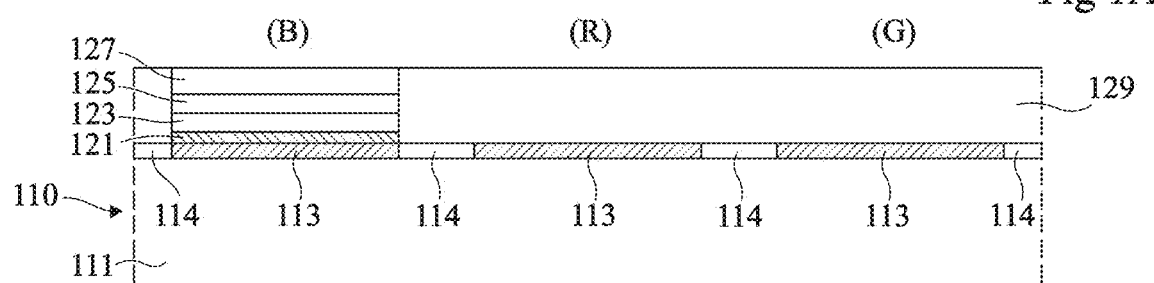

FIG. 1B illustrates a step of planarization of the upper surface of the structure obtained at the end of the step of FIG. 1A. During this step, the volume laterally separating the active portions of the diodes of the B pixels is filled with an insulating filling material 129, for example, silicon oxide or resin, to obtain a structure having a substantially planar upper surface. As an example, filling material 129 is first deposited over the entire upper surface of the structure, including above the B pixels, across a thickness greater than that of the active stacks of diodes of the B pixels, after which a planarization step is implemented, for example, by chem.-mech. polishing, during which the filling material is only kept around the active stacks of the diodes of the B pixels, across a thickness substantially equal to that of the active stacks.

Figure 1C:
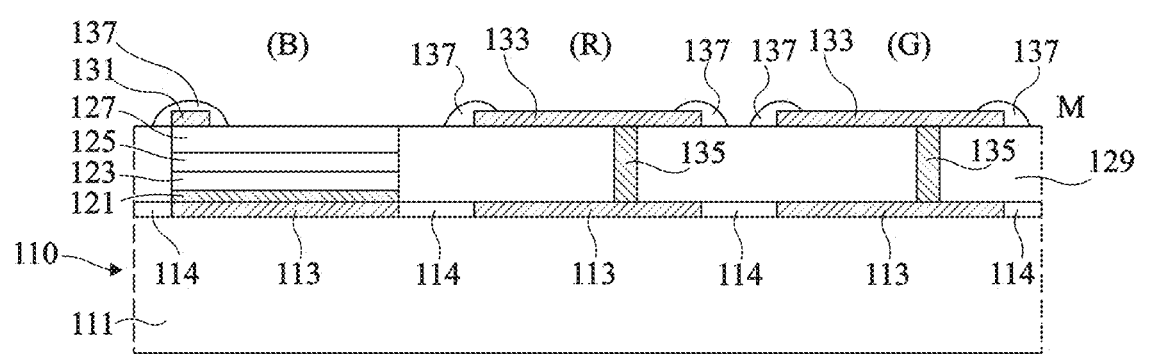

FIG. 1C illustrates a step of simultaneous forming, in a same conductive level M, for example, metallic, of upper electrodes 131 of the inorganic diodes of the B pixels of the device, and of lower electrodes 133 of the organic diodes of the R and G pixels of the device. Conductive level here means an assembly of conductive regions formed simultaneously and arranged in a same mean plane substantially parallel to the upper surface of control circuit 110.

More particularly, during this step, a cathode electrode 131 arranged on top of and in contact with the upper surface of cathode layer 127 of the pixel diode is formed on each B pixel of the device. In this example, electrode 131 only covers a portion of the upper surface of the diode of pixel B. Indeed, the device described in relation with FIGS. 1A, 1B, 1C, and 1D is intended to emit light from its upper surface, and electrode 131 should thus not entirely mask the upper surface of the diode of the B pixel. As an example, electrode 131 extends, in top view, over all or part of a peripheral region of the diode of the B pixel.

During this step, an electrode 133 arranged on the upper surface of insulating filling layer 129, for example, vertically in line with connection pad 113 of the pixel, is further formed on each R pixel and on each G pixel of the device. Electrode 133 for example extends all over the surface of the organic light-emitting diode (not formed yet) of the pixel. Electrode 133 is connected to the underlying connection pad 113 of the pixel via a conductive via 135, for example, made of tungsten or of copper, crossing insulating layer 129. Vias 135 may be formed after the deposition of insulating layer 129 and before the forming of electrodes 131 and 133, during a step, not detailed. It should be noted that pad 113 has the function of electrically powering electrode 133 through via 135. Thus, as a variation, pad 113 may have a surface area smaller or greater than that of electrode 133 and/or be shifted (in top view) with respect to electrode 133.

Preferably, electrodes 133 (and accordingly electrodes 131, the latter being formed in the same conductive level M as electrodes 133) are provided to have an upper surface reflective for the light originating from the upper portion of the device. This enables to increase the light efficiency of the device by reflecting towards it upper surface the light emitted by the organic light-emitting diodes towards its lower surface. As an example, electrodes 133 comprise at least one upper layer made of silver, of tin oxide, of aluminum, of an aluminum-copper alloy, or of a transparent conductive oxide (ZnO, AZO, ITO, etc.).

Vias 135 and electrodes 131 and 133 may be formed according to conventional photolithography methods of the type currently used for the manufacturing of integrated circuits, for example, in CMOS technology.

FIG. 1C further illustrates a step subsequent to the forming of electrodes 131 and 133, during which a local insulation layer 137, for example, made of resin, is deposited over the entire upper surface and on the sides of metallizations 131, to insulate metallizations 131 from the upper layers (not shown in FIG. 1C) of the device. Insulation layer 137 however does not extend over at least a portion of the upper surface of the lower electrodes 133 of the diodes of the R and G pixels. In the shown example, insulation layer 137 extends over a peripheral region and on the sides of each electrode 133, to reinforce the insulation between the diodes of neighboring pixels of the device, and to round the edges formed by electrodes 133 for the subsequent deposition of an organic semiconductor layer. Local insulation layer 137 is for example made of resist. The resist is for example first spread all over the upper surface of the device, and then illuminated and etched to only keep the resist in the desired regions.

Figure 1D:
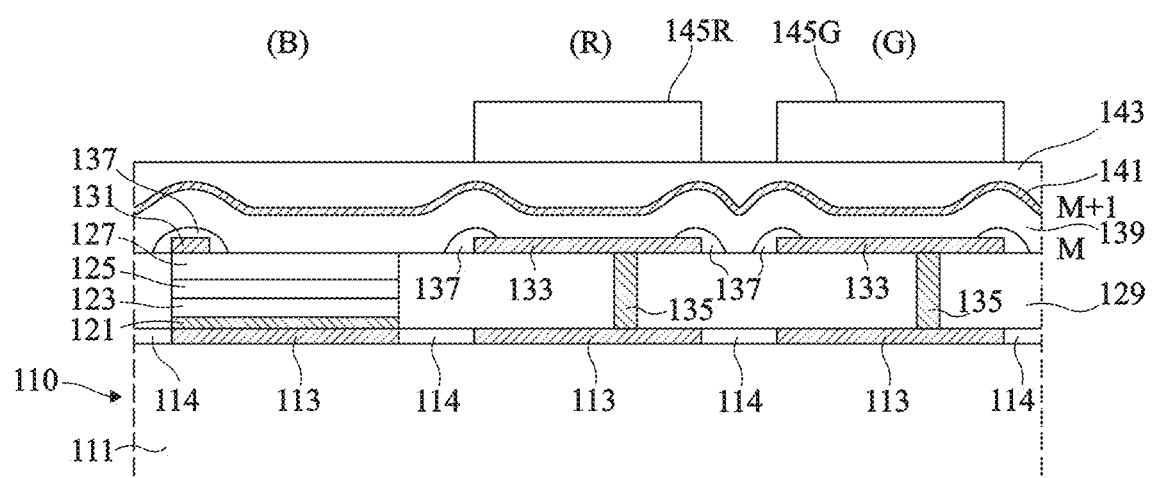

FIG. 1D illustrates a step of deposition of an organic semiconductor layer 139 over the upper surface of the structure obtained at the end of the sequence of steps of FIG. 1C. Layer 139 is an active organic light-emitting diode layer. Layer 139 may be a single layer made of a mixture of organic semiconductor materials of opposite conductivity types, or a vertical stack of at least two layers of organic semiconductor materials of opposite conductivity types. More generally, any stack of one or a plurality of organic semiconductor layers capable of emitting light when crossed by a current may be used. In this example, organic semiconductor layer 139 is selected to be capable of simultaneously emitting green light and red light. As a variation, organic semiconductor layer 139 is selected to be capable of emitting white light, that is, to be capable of simultaneously emitting blue light, green light, and red light. Organic semiconductor layer 139 continuously extends over substantially the entire upper surface of the structure obtained at the end of the sequence of steps of FIG. 1C. In particular, organic semiconductor layer 139 has its lower surface in electrical contact with lower electrodes 133 of the R and G pixels of the device. Local insulation layer 137 however enables organic semiconductor layer 139 not to be in electric contact with the upper electrodes 131 of the B pixels of the device. It should be noted that according to the materials selected to form electrodes 133 and organic layer 139, one or a plurality of conductive matching layers may be deposited over the upper surface of the structure obtained at the end of the sequence of steps of FIG. 1C, before the deposition of organic semiconductor layer 139.

FIG. 1D further illustrates a step of deposition, over the upper surface of organic semiconductor layer 139, of a conductive layer 141 corresponding to the upper electrode of the R and G pixels of the device. Layer 141 is formed in a conductive level M+1 located above level M. Conductive layer 141 forms an electrode common to all the R and G pixels of the device. In this example, layer 141 is a continuous layer extending over substantially the entire upper surface of the device. The device being intended to be viewed on its upper surface side, upper electrode layer 141 is selected to be capable of transmitting the most part of the light emitted by the organic light-emitting diodes of the R and G pixels, and by the inorganic light-emitting diodes of the B pixels. As an example, electrode 141 is a metal electrode, for example, made of silver, having a thickness smaller than 10 nm, or an electrode made of a transparent conductive material, for example, made of indium tin oxide. In practice, according to the materials selected to form organic semiconductor layer 139 and upper electrode 141, one or a plurality of matching conductive layers may be deposited over the upper surface of layer 139, before the deposition of conductive layer 141.

FIG. 1D further illustrates a step of deposition, over the upper surface of conductive layer 141, of an encapsulation layer 143, particularly having the function of preventing the penetration of air or moisture into organic semiconductor layer 139. As an example, encapsulation layer 143 is deposited by ALD ("Atomic Layer Deposition"). Layer 143 is for example made of silicon oxide ($SiO_2$) or of aluminum oxide ($Al_2O_3$).

FIG. 1D further illustrates a step of deposition, above the organic light-emitting diode of each R, respectively G, pixel, of a color filter 145R, respectively 145G, for example, made of colored resin. Filter 145R only transmits a first portion of the spectrum of the light emitted by the underlying light-emitting diode, and filter 145G only transmits a second portion (different from the first portion) of the spectrum of the light emitted by the underlying light-emitting diode. In this example, filter 145R only transmits red light and filter 145G only transmits green light. As a variation, in each B pixel, the inorganic light-emitting diode is further topped with a color filter (not shown), for example, made of colored resin, having a bandwidth different from that of filters 145R and 145G, for example, a filter capable of only transmitting blue light. The provision of a filter on the B pixels for example enables to correct a possible dispersion of the wavelength of the light emitted by the inorganic light-emitting diode of the pixel, induced by organic semiconductor layer 139. The provision of a specific filter on the B pixels may further enable to compensate for a possible luminosity difference between the inorganic light-emitting diodes of the B pixels and the organic light-emitting diodes of the R and G pixels. Indeed, the elementary cells of control of control circuit 110 are preferably all identical to simplify the forming of circuit 110. In this case, the diodes of the B, R, and G pixels receive substantially the same power supply voltage. In the case where, for a same power supply voltage, the inorganic diodes of the B pixels emit at a higher luminance level than the organic light-emitting diodes of the R and G pixels, the provision of a color filter on the B pixels may enable to attenuate the luminance level of the B pixels to take it to a level equivalent to that of the R and G pixels.

Thus, the device obtained at the end of the sequence of steps of FIG. 1D comprises B, R, and G pixels capable of emitting light respectively in three different wavebands, each pixel B comprising an inorganic light-emitting diode and each R or G pixel comprising an organic light-emitting diode.

In this example, the lower electrodes 133 of the light-emitting diodes of the R and G pixels correspond to the anode electrodes of the organic light-emitting diodes, and the upper electrode 141 corresponds to the cathode electrode of the organic light-emitting diodes.

Figure 2:
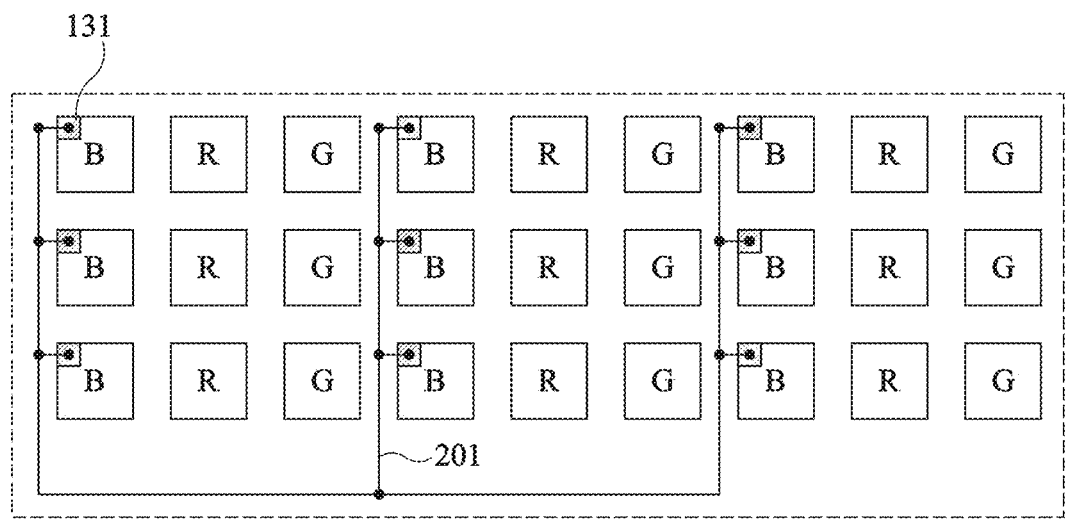
FIG. 2 is a top view schematically illustrating an embodiment of a color image display device.

FIG. 2 is a top view schematically illustrating an example of layout of the B, R, and G pixels of the device of FIG. 1D. In FIG. 2, the pixels are schematized by squares. Further, on each B pixel, the upper electrode 131 of the pixel diode is shown by a hatched square. FIG. 2 also shows, by a rectangle in broken lines, the upper electrode 141 of the R and G pixels. In top view, the B, R, and G pixels are for example arranged in an array of rows and columns.

The upper electrodes 131 of the B pixels of the device are connected to one another via a network of conductive tracks 201 (not shown in FIGS. 1A, 1B, 1C, 1D) formed in conductive level M at the same time as electrodes 131 and 133. The insulation layer 137 (FIGS. 1C and 1D) covering the upper electrodes 131 of the B pixels further covers the upper surface and the sides of conductive tracks 201, to insulate the network of conductive tracks 201 from the organic semiconductor layer 139 (FIG. 1D) of the device.

Network 201 of conductive tracks of interconnection of electrodes 131 is connected, outside of the pixel array, for example, at the periphery of the pixel array, to the upper electrode 141 common to the organic light-emitting diodes of the R and G pixels. This enables to interconnect the upper electrodes of all the light-emitting diodes of the device, the individual control of each diode being performed by its lower electrode 121 or 133, via the corresponding connection pad 113 of control circuit 110.

It should be noted that in the above-described example, only the lower electrode layer 133 of the organic light-emitting diodes is pixelated, organic semiconductor layer 139 and upper electrode layer 141 being continuous layers.

Figure 3:
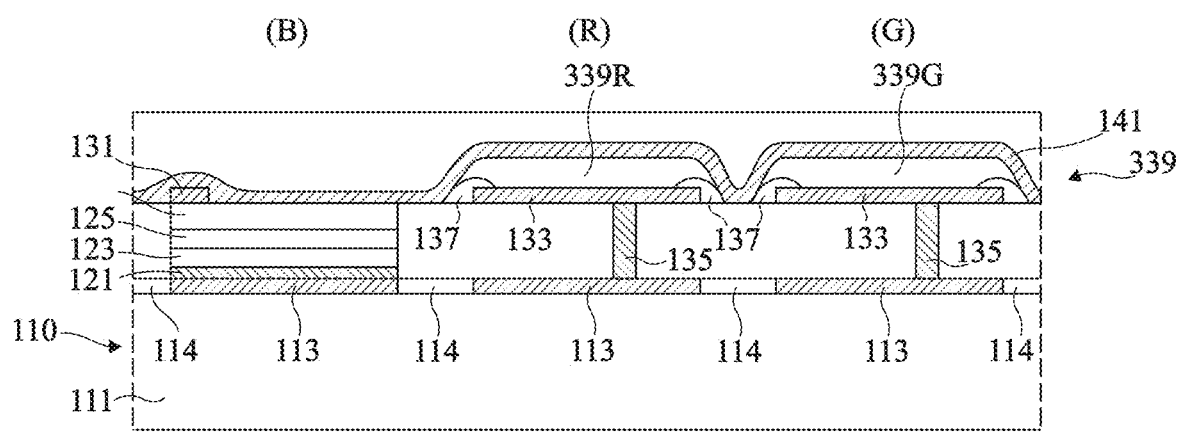
FIG. 3 is a cross-section view schematically illustrating another embodiment of a color image display device.

FIG. 3 is a partial simplified cross-section view schematically illustrating another embodiment of a color image display device.

The device of FIG. 3 differs from the above-described device mainly in that, in the device of FIG. 3, the continuous organic semiconductor layer 139 of the previously-described device is replaced with a discontinuous organic semiconductor layer 339, located only at the level of the organic light-emitting diodes of the R and G pixels of the device.

The forming of the device of FIG. 3 for example comprises the same steps as those described in relation with FIGS. 1A, 1B, and 1C.

The forming of the device of FIG. 3 further comprises a step of deposition of an organic semiconductor layer 339 on the upper surface of the structure obtained at the end of the sequence of steps of FIG. 1C. Layer 339 is a discontinuous layer located at the level of the R and G pixels of the device only, and in particular does not extend above the B pixels of the device. More particularly, layer 339 comprises, at the level of each pixel R, a portion 339R in electric contact with lower electrode 133 of the pixel and, at the level of each pixel G, a portion 339G in electric contact with lower electrode 133 of the pixel. Layers 339R and 339G are active organic light-emitting diodes layers of different natures. More particularly, each portion 339R is capable of emitting light in a first wavelength range when it conducts an electric current, and each portion 339G is capable of emitting light in a second wavelength range different from the first range when it conducts an electric current. As an example, layer 339R is selected to be capable of emitting red light only, and layer 339G is selected to be capable of emitting green light only. Local layers 339R and 339G are for example deposited by silk screening or by means of stencils or by any other method of local deposition of an organic semiconductor layer.

The upper electrode 141 common to the R and G pixels is then deposited similarly or identically to what has been previously described. In particular, electrode 141 may be a continuous electrode extending over substantially the entire surface of the device, including above the B pixels. Encapsulation layer 143 can then be deposited identically or similarly to what has been previously described, all over the upper surface of the device.

It should be noted that in the example of FIG. 3, since organic semiconductor layer 339 does not extend above the B pixels of the device, the upper electrode 131 of the B pixels needs no insulation. Thus, local insulating layer 137 may be omitted at least at the level of the upper electrodes 131 of the B pixels. In the case where, as shown in FIG. 3, the upper electrode 141 of the R and G pixels extends over substantially the entire surface of the device, including above the B pixels, the lower surface of electrode 141 then directly comes into contact with the upper surface of electrodes 131, which provides the interconnection of the upper electrodes of all the diodes of the device.

Due to the provision of semiconductor layers 339R and 339G specifically adapted to the emission wavelengths of the R and G pixels, respectively, the color filters 145R, 145G topping the R and G pixels of the device of FIG. 1D may be omitted in the device of FIG. 3.

In practice, the embodiment of FIG. 3 is well adapted to display devices where the pixels have a significant size, for example, their smallest dimension in top view being greater than 20 μm and preferably greater than 50 μm. The embodiment of FIG. 1D is well adapted to display devices where the pixels have a relatively small size, for example, their smallest dimension in top view being smaller than 20 μm and preferably smaller than 5 μm, for which the local deposition of an organic semiconductor layer would be difficult to perform.

Specific embodiments have been described. Various alterations and modifications will occur to those skilled in the art. In particular, embodiments where, in each pixel of the device, the lower electrode of the pixel diode is the anode electrode and the upper electrode of the pixel diode is the cathode electrode have been described. It will be within the abilities of those skilled in the art to adapt the embodiments by inverting the polarity of the diodes of the device.

Further, although only embodiments of display devices comprising one inorganic pixel type (B pixels) and two organic pixel types (R and G pixels) have been described, the described embodiments are not limited to this specific case. As a variation, the display device may comprise a plurality of types of inorganic pixels, each comprising a gallium nitride light-emitting diode and capable of emitting in different wavelength ranges. Further, the display device may comprise a single type of organic pixel or more than two types of organic pixel capable of emitting in different wavelength ranges.

The invention claimed is:

1. A monolithic display device comprising:
a plurality of first pixels capable of emitting light in a first wavelength range, and a plurality of second pixels capable of emitting light in a second wavelength range, wherein the plurality of first pixels each comprising a gallium nitride light-emitting diode, and the plurality of second pixels each comprising an organic light-emitting diode; and
an integrated control circuit comprising, on a side of a first surface, for each pixel, a metal connection pad, the light-emitting diodes of the plurality of first and second pixels being arranged on the side of the first surface of the integrated control circuit, and the light-emitting diode of each pixel comprising a first electrode connected to the metal connection pad of the pixel,
wherein, in each pixel, the light-emitting diodes of the pixel comprises at least one semiconductor layer coating a surface of the first electrode opposite to the integrated control circuit, and a second electrode coating a surface of said at least one semiconductor layer opposite to the first electrode, the second electrodes of the plurality of first pixels and the first electrodes of the plurality of second pixels being arranged in a same conductor level of the monolithic display device.

2. The device of claim 1, wherein the second electrode of the light-emitting diodes of the plurality of first and second pixels are interconnected.

3. The device of claim 1, wherein said at least one semiconductor layer of the plurality of second pixels is a continuous layer common to all the plurality of second pixels of the monolithic display device and extending over an entire surface of the monolithic display device.

4. The device of claim 3, wherein, in each first pixel, the second electrode of the pixel is insulated from said at least one semiconductor layer of the plurality of second pixels by a local insulation layer.

5. The device of claim 1, wherein said at least one semiconductor layer of the plurality of second pixels is a discontinuous layer located at the level of the light-emitting diodes of the plurality of second pixels only.

6. A method of manufacturing a monolithic display device comprising a plurality of first pixels capable of emitting light in a first wavelength grange and a plurality of second pixels capable of emitting light in a second wavelength range, the method comprising the successive steps of:

a) forming an integrated control circuit comprising, on a first surface, for each pixel of the plurality of first and second pixels of the monolithic display device, a metal connection pad;

b) for each first pixel of the plurality of first pixels, placing on the first surface of the integrated control circuit an active gallium nitride light-emitting diode stack comprising a first electrode in contact with the metal connection pad of the first pixel, and at least one semiconductor layer coating a surface of the first electrode opposite to the integrated control circuit;

c) filling a volume laterally separating the active gallium nitride light-emitting diode stack with an insulating filling material;

d) forming in a same conductor level, for each of the first pixel, a second electrode coating a surface of said at least one semiconductor layer opposite to the first electrode and, for each of the second pixel, a first electrode coating the insulating filling material and connected to the metal connection pad each of the second pixel.

7. The method of claim 6, further comprising, after the step d), a step e) of deposition, for each the second pixel, at least one organic semiconductor layer coating a surface of the first electrode of the second pixel opposite to the integrated control circuit.

8. The method of claim 7, wherein said at least one organic semiconductor layer is a continuous layer common to all of the plurality of second pixels of the monolithic display device and extending over an entire surface of the monolithic display device.

9. The method of claim 8, further comprising, between the step d) and the step e), a step of forming a local insulation layer insulating the second electrodes of the plurality of first pixels from said at least one organic semiconductor layer.

10. The method of claim 7, wherein said at least one organic semiconductor layer is a discontinuous layer located at the level of the light-emitting diodes of the plurality of second pixels only.

11. The method of claim 7, further comprising, after the step e), a step of deposition, for each of the pixel, a second electrode coating a surface of said at least one organic semiconductor layer opposite to the first electrode of the pixel.

12. The method of claim 11, wherein the second electrodes of the plurality of second pixels form a continuous layer extending over the entire surface of the monolithic display device.

* * * * *

UNITED STATES PATENT AND TRADEMARK OFFICE
CERTIFICATE OF CORRECTION

PATENT NO. : 10,804,326 B2
APPLICATION NO. : 16/335149
DATED : October 13, 2020
INVENTOR(S) : Tony Maindron et al.

Page 1 of 1

It is certified that error appears in the above-identified patent and that said Letters Patent is hereby corrected as shown below:

In the Claims

Column 10, Claim 1, Line 19 should read -- wherein the plurality of first pixels, --

Column 10, Claim 1, Line 21 should read -- second pixels, each comprising --

Column 10, Claim 6, Line 57 should read -- in a first wavelength range --

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*